(12) United States Patent
He et al.

(10) Patent No.: US 7,399,692 B2
(45) Date of Patent: Jul. 15, 2008

(54) III-NITRIDE SEMICONDUCTOR FABRICATION

(75) Inventors: Zhi He, El Segundo, CA (US); Robert Beach, Altadena, CA (US)

(73) Assignee: International Rectifier Corporation, El Segundo, CA (US)

( * ) Notice: Subject to any disclaimer, the term of this patent is extended or adjusted under 35 U.S.C. 154(b) by 19 days.

(21) Appl. No.: 11/537,304

(22) Filed: Sep. 29, 2006

(65) Prior Publication Data

US 2007/0077745 A1 Apr. 5, 2007

Related U.S. Application Data

(60) Provisional application No. 60/723,040, filed on Oct. 3, 2005.

(51) Int. Cl.
*H01L 21/3205* (2006.01)

(52) U.S. Cl. .................. 438/604; 438/602; 438/46; 257/77; 257/11; 257/78; 257/189; 257/E21.097; 257/E21.098; 257/E21.112; 257/E21.113; 257/E21.121; 257/E21.126; 257/E21.127; 257/E21.138

(58) Field of Classification Search .......... 438/604, 438/602, 46; 257/11, 77, 78, 189, E21.097, 257/E21.098, E21.112, E21.113, E21.121, 257/E21.126, E21.127, E21.138
See application file for complete search history.

(56) References Cited

U.S. PATENT DOCUMENTS

| | | | |
|---|---|---|---|
| 6,316,793 B1 | 11/2001 | Sheppard et al. | |
| 6,720,586 B1 | 4/2004 | Kidoguchi et al. | |
| 7,247,889 B2 * | 7/2007 | Hanson et al. | 257/189 |
| 2002/0182839 A1 * | 12/2002 | Ogawa et al. | 438/604 |
| 2005/0173728 A1 | 8/2005 | Saxler | |
| 2007/0023761 A1 * | 2/2007 | Robbins | 257/77 |
| 2007/0141823 A1 * | 6/2007 | Preble et al. | 438/604 |

OTHER PUBLICATIONS

International Search Report dated Mar. 25, 2008 issued in PCT Application No. PCT/US06/38678.

* cited by examiner

*Primary Examiner*—Michael S. Lebentritt
*Assistant Examiner*—Mohsen Ahmadi
(74) *Attorney, Agent, or Firm*—Ostrolenk, Faber, Gerb & Soffen, LLP

(57) ABSTRACT

A process for fabricating a III-nitride power semiconductor device which includes forming a gate structure while providing a protective body over areas that are to receive power electrodes.

25 Claims, 7 Drawing Sheets

Band Diagram under the gate
- AlGaN thick ⇒ No charge at zero bias
- Positive bias to induce 2DEG

Band Diagram in source and drain access regions
- High charge for low on resistance
- No AlGaN

US 7,399,692 B2

III-NITRIDE SEMICONDUCTOR FABRICATION

RELATED APPLICATION

This application is based on and claims the benefit of U.S. Provisional Application Ser. No. 60/723,040, filed on Oct. 3, 2005, entitled RE-GROWING AlGaN N-FACED MATERIALS TO PRODUCE SELF-ALIGNED NORMALLY-OFF AlGaN/GaN HEMT, to which a claim of priority is hereby made and the disclosure of which is incorporated by reference.

FIELD OF THE INVENTION

The present invention relates to semiconductor devices and more particularly to III-nitride power semiconductor devices.

DEFINITIONS

A III-nitride semiconductor as used herein refers to a semiconductor which includes nitrogen and at least one element from group III, such as AlN, GaN, AlGaN, InN, InGaN, InAlGaN

BACKGROUND OF THE INVENTION

The large dielectric breakdown field (>2.2 MV/cm) and the high current density of the two dimensional electron gas (2-DEG) in III-nitride heterojunction semiconductor devices make them attractive for power applications.

One known III-nitride heterojunction power semiconductor device is a high electron mobility transistor (HEMT). A desirable variation of a HEMT is a normally-off HEMT; i.e. a HEMT which does not allow for conduction of current (except for minute leakage current) in the absence of an appropriate voltage to its gate electrode.

FIG. 1 illustrates a normally-off III-nitride power semiconductor device, which includes a III-nitride semiconductor stack 1. Stack 1 includes N-polar GaN layer 2, N-polar AlGaN layer 3, N-polar GaN layer 4, and N-polar AlGaN layer 5, each usually grown using molecular beam epitaxy (MBE).

To fabricate a device according to FIG. 1, stack 1 is grown first, and then AlGaN layer is etched away to define areas for power electrodes (e.g. source and drain electrodes) 6,7. Gate structure 8 which may include a gate insulation and gate electrode stack or a schottky gate electrode is then formed on the remainder of AlGaN layer 5.

AlGaN layer 5 under gate structure 8 pulls the conduction band above the Fermi energy and removes the 2DEG under gate structure 8. As a result the device is rendered normally-off.

While fabricating a device according to FIG. 1, N-polar GaN layer 4 is damaged during the etching of AlGaN layer 5. As a result, the quality of the ohmic contact between power electrodes 6,7 and GaN layer 4 is diminished, resulting in a lesser quality device.

SUMMARY OF THE INVENTION

In a process according to the present invention, the gate structure is defined first, while the III-nitride semiconductor body that is to receive the power electrodes is protected by a protective spacer body.

In the preferred embodiment of the present invention, a device is fabricated by growing a first N-polar III-nitride semiconductor body over a support body; growing a second N-polar III-nitride semiconductor body over the first N-polar III-nitride semiconductor body; growing a third N-polar III-nitride semiconductor body over the second N-polar III-nitride semiconductor body; growing a protective spacer body over the third III-nitride semiconductor body; removing a portion of the protective spacer body to define an opening therein exposing a portion of the third III-nitride semiconductor body for receiving a gate structure; growing a fourth N-polar III-nitride semiconductor body at least over the exposed portion; and forming a gate structure over the fourth III-nitride semiconductor body.

An invention according to the present invention, however, may not be limited to N-polar III-nitride devices. Thus, in an alternative embodiment, a device according to the present invention may be fabricated by growing a first III-nitride semiconductor body over a support body; growing a second III-nitride semiconductor body over the first N-polar III-nitride semiconductor body; growing a third III-nitride semiconductor body over the second N-polar III-nitride semiconductor body; growing a protective spacer body over the third III-nitride semiconductor body; removing a portion of the protective spacer body to define an opening therein exposing a portion of the third III-nitride semiconductor body for receiving a gate structure; and forming a gate structure over the third III-nitride semiconductor body.

In a process according to the present invention, the protective spacer body also acts as an etch stop while the gate structure is being formed. A list of suitable materials for forming the protective spacer body includes Ge, $SiO_2$, $Si_3N_4$, $Al_2O_3$, or the like material.

Other features and advantages of the present invention will become apparent from the following description of the invention which refers to the accompanying drawings.

DETAILED DESCRIPTION OF THE FIGURES

Figure 1:
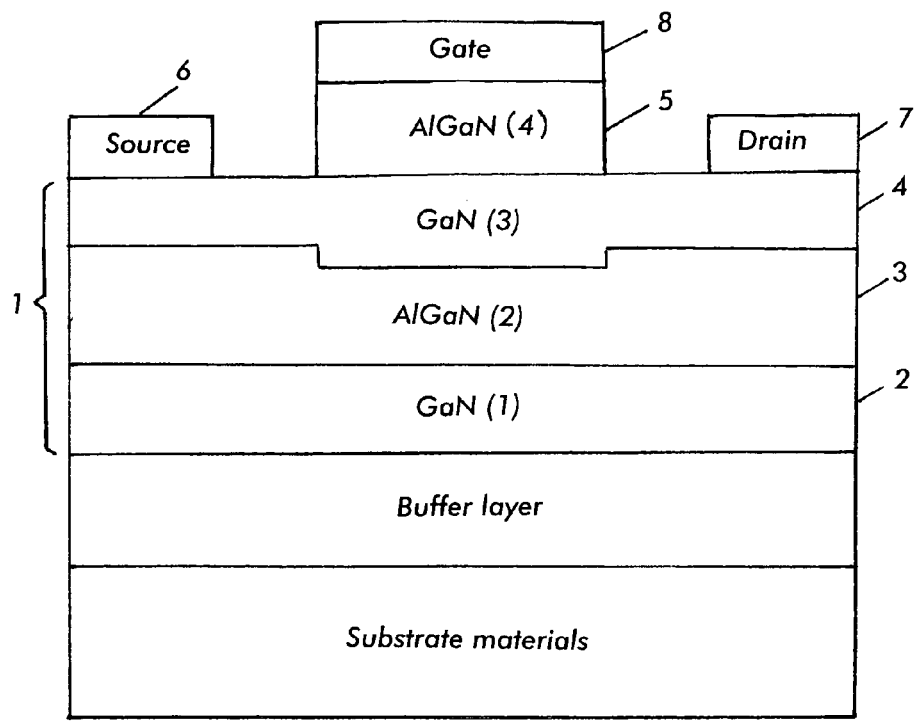
FIG. 1 illustrates a portion of the active region of a normally-off III-nitride power semiconductor device.
Figure 2:
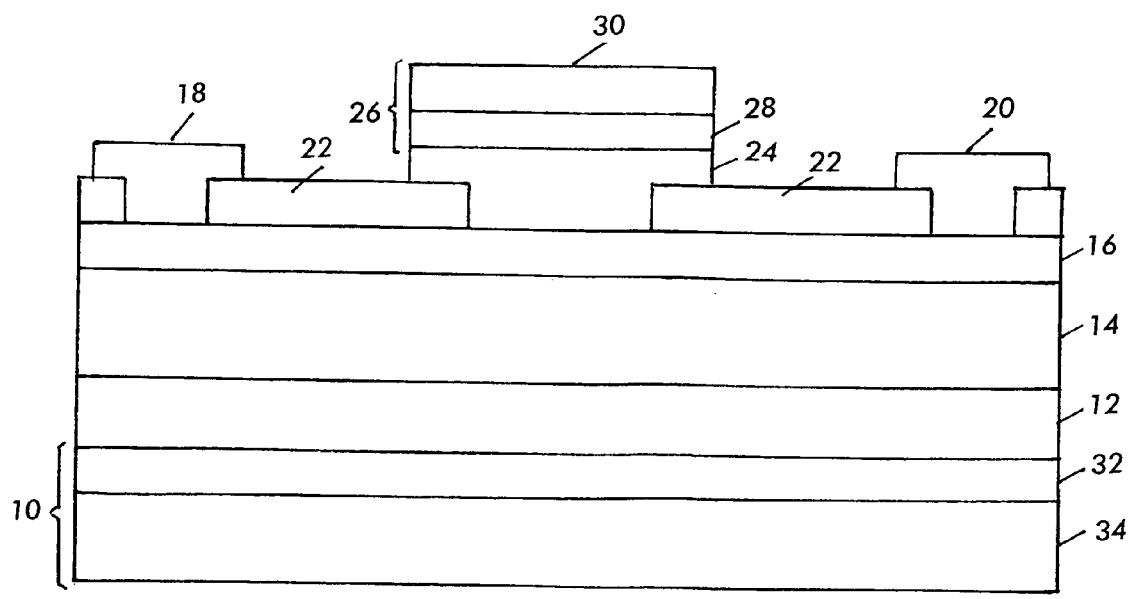
FIG. 2 illustrates a portion of the active region of a III-nitride semiconductor device fabricated according to the present invention.

Referring to FIG. 2, a III-nitride power semiconductor device fabricated according to the preferred embodiment of the present invention includes a support body 10, first N-polar III-nitride semiconductor body 12, which is preferably composed of N-polar GaN, second N-polar III-nitride semiconductor body 14, which is preferably composed of N-polar AlGaN, formed over body 12, third N-polar III-nitride semiconductor body 16, which is preferably composed of N-polar GaN, formed over body 14, first power electrode (e.g., source electrode) in ohmic contact with body 16, second power electrode 20 (e.g., drain electrode) in ohmic contact with body 16, spaced spacer bodies 22 formed over body 16, fourth N-polar III-nitride semiconductor body 24 which is preferably composed of N-polar AlGaN, formed over body 16 between spacer bodies 22, and gate structure 26 formed over body 24.

In the preferred embodiment, gate structure 26 includes gate insulation 28, composed of, for example, $SiO_2$, or $Si_3N_4$, and gate electrode 30 composed of any suitable gate material, including metallic or non-metallic gate materials.

Support body 10 in the preferred embodiment includes substrate 32 and, when required, buffer layer 34. In the preferred embodiment, substrate 32 is composed of silicon, and buffer layer 34 is composed of AlN. Other substrate materials include SiC, sapphire, or a III-nitride substrate, e.g., GaN substrate. Note that if a GaN substrate is used, a buffer layer may not be necessary.

Referring now to FIGS. 3A-3D, according to the first embodiment of the present invention, first (12), second (14), third (16) N-polar III-nitride bodies are grown over support body 10, which preferably includes silicon substrate 32, and AlN buffer layer 34. First (12), second (14), and third (16) are composed respectively of N-polar GaN, N-polar AlGaN, and N-polar GaN.

Figure 3A:
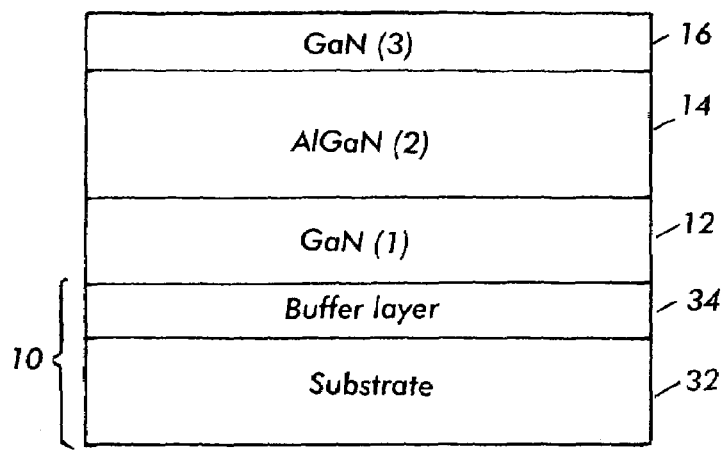
FIGS. 3A-3D illustrate a process according to the preferred embodiment of the present invention.
Figure 3B:
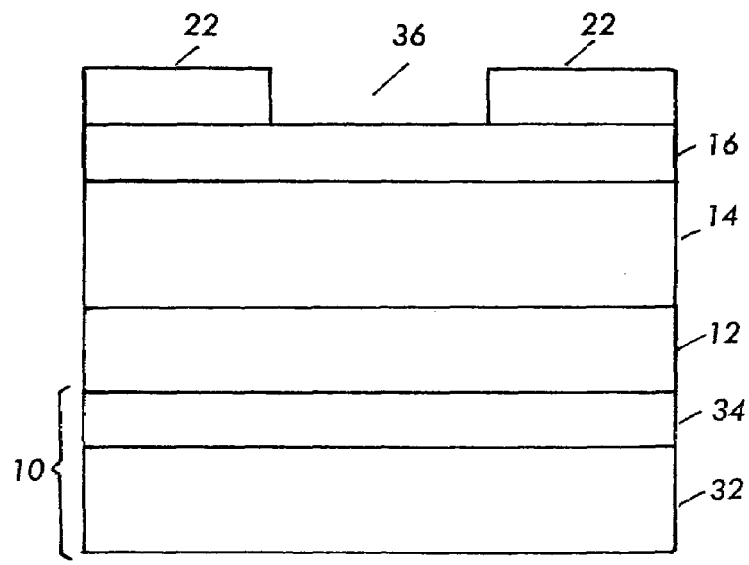

Next, a layer of spacer material (preferably Ge) is deposited or grown on third N-polar III-nitride body 16, and patterned through photolithography or the like technique to obtain spaced spacer bodies 22 as illustrated by FIG. 3B. Note gap 36 between spacer bodies 22 exposes at least third N-polar III-nitride body 16 and defines an area for receiving a gate structure.

Figure 3C:
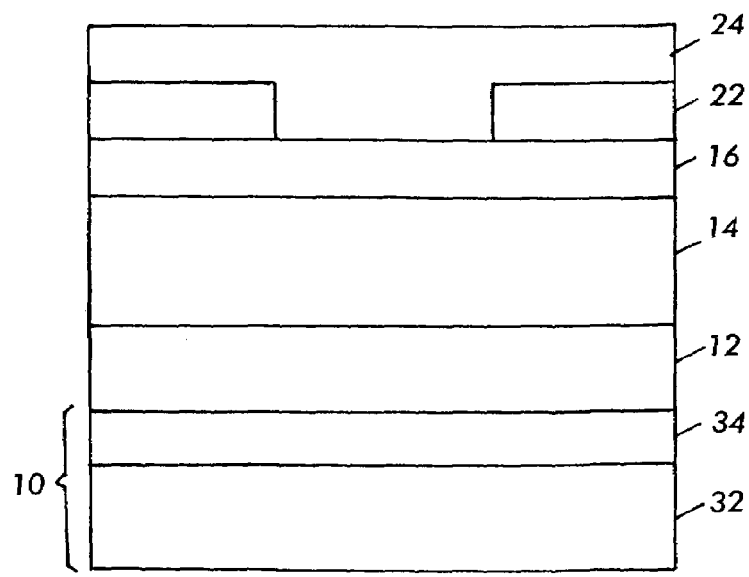
Figure 3D:
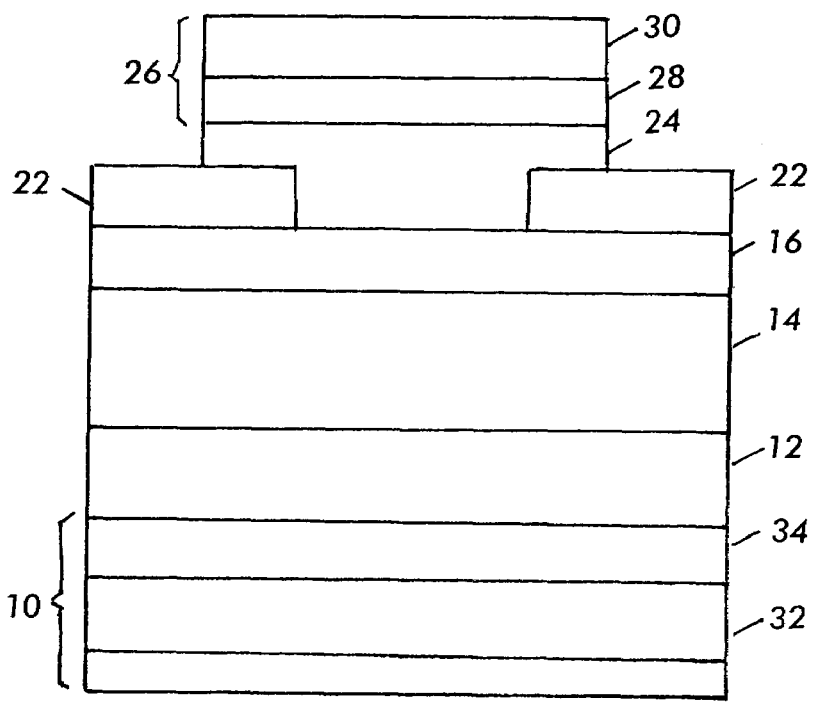

Thereafter, a fourth N-polar III-nitride body (N-polar AlGaN in the preferred embodiment) is grown over at least third N-polar III-nitride semiconductor body 16, and, in the preferred embodiment over spacers 22, as illustrated by FIG. 3C.

Next, bodies for fabricating gate structure 26 are formed on fourth N-polar III-nitride body 24 and the stack is patterned using photolithography or the like to obtain gate structure 26 of the preferred embodiment. Thus, a gate insulation body and a gate electrode body are formed on fourth N-polar III-nitride body 24, and patterned to obtain gate insulation 28 and gate electrode 30.

After gate structure 26 is formed, spacers 22 are further patterned using photolithography or the like whereby openings therein expose third N-polar III-nitride body 16 defining areas for receiving power electrodes. First and second power electrodes 18 and 20 are then formed over third body 16 to obtain a device according to the preferred embodiment as illustrated by FIG. 2.

Figure 4:
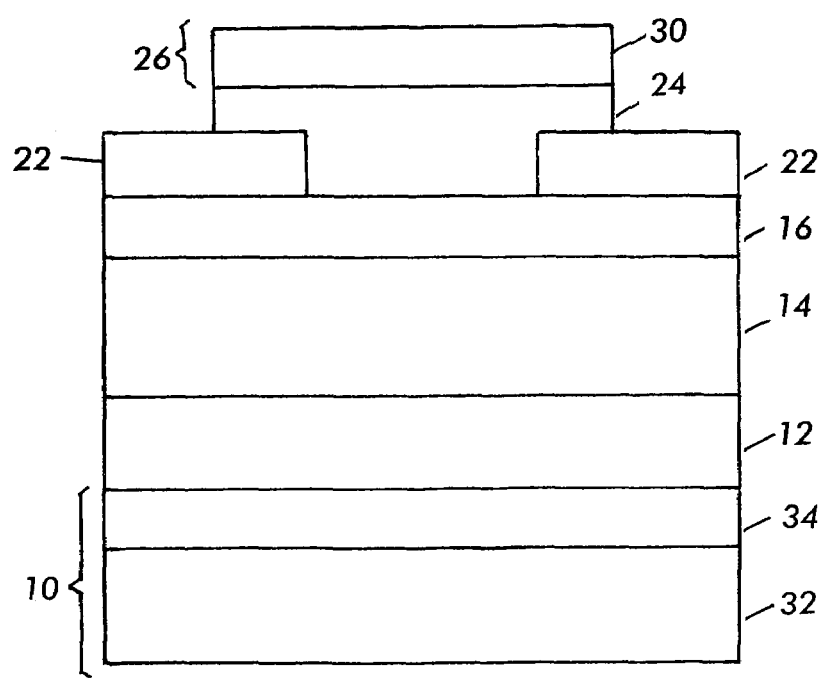
FIG. 4 illustrates an alternative gate structure for a device fabricated according to the present invention.
Figure 5:
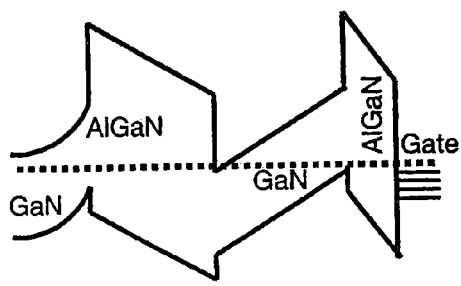
FIGS. 5 and 6 illustrate respectively the band diagrams for a region under the gate and regions under the power electrodes for a device fabricated according to the present invention.
Figure 6:
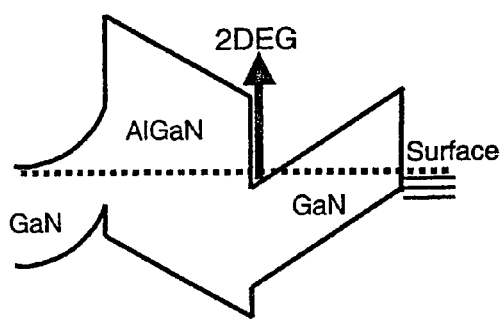

Referring to FIG. 4, in the second embodiment of the present invention, gate structure 26 is formed with a material that makes schottky contact with fourth N-polar III-nitride semiconductor body 24. The remainder of the process is the same as the first embodiment of the present invention.

A process according to the present invention is not limited to N-polar III-nitride semiconductor devices. Rather, it may be applied to any semiconductor device.

Referring to FIGS. 7A-7E, in which like numerals identify like features, in a process according to the third embodiment, first III-nitride semiconductor body 12' (e.g., GaN), second III-nitride semiconductor body 14' (AlGaN), and third semiconductor body 16' (e.g. GaN) are grown in sequence on a support body 10. Note that bodies 12', 14' and 16' need not be N-polar.

Figure 7A:
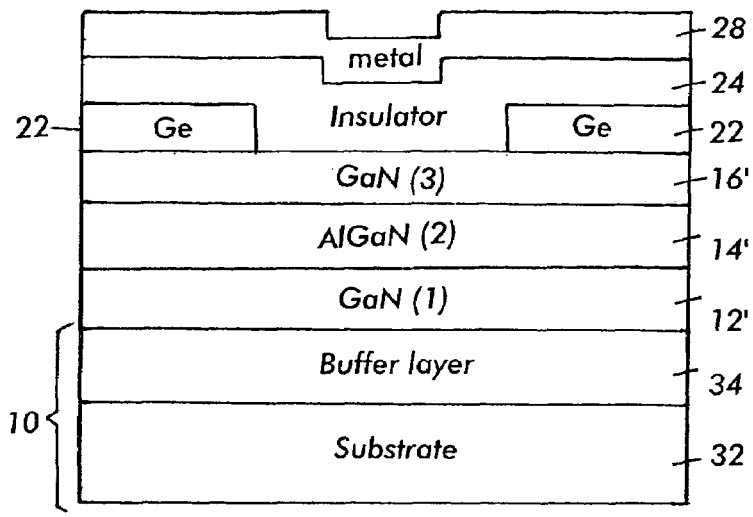
FIGS. 7A-7F illustrate a process according to another embodiment of the present invention.

According to an aspect of the present invention, protective body 22 is formed on third III-nitride body 16', and patterned through photolithography or the like to include a gate opening to expose a portion of III-nitride body 16' for receiving a gate structure. Thereafter, a gate insulation body 24 is formed over spacer body 22 and over third III-nitride body 16' at the bottom of the gate opening therein. A gate electrode body 28 is then formed over gate insulation body 24. The result is illustrated by FIG. 7A.

Figure 7B:
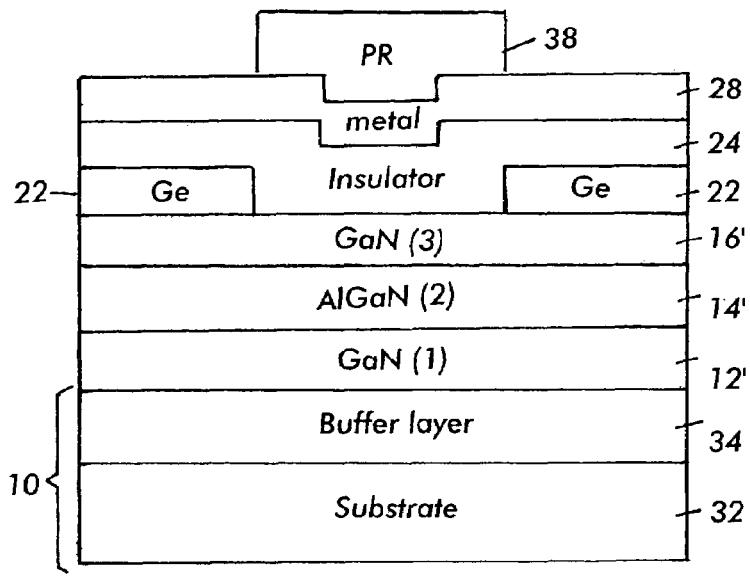
Figure 7C:
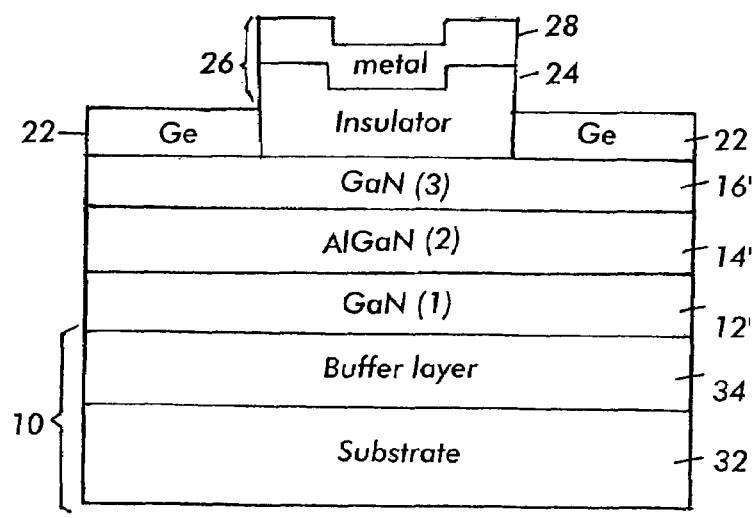

Next, a gate mask 38 is formed over gate electrode body 28 aligned with the gate opening in spacer body 22 as illustrated by FIG. 7B. Thereafter, the unmasked portions of gate electrode body 28, and gate insulation body 24 are removed until protective body 22 is reached. The result is illustrated by FIG. 7C.

Figure 7D:
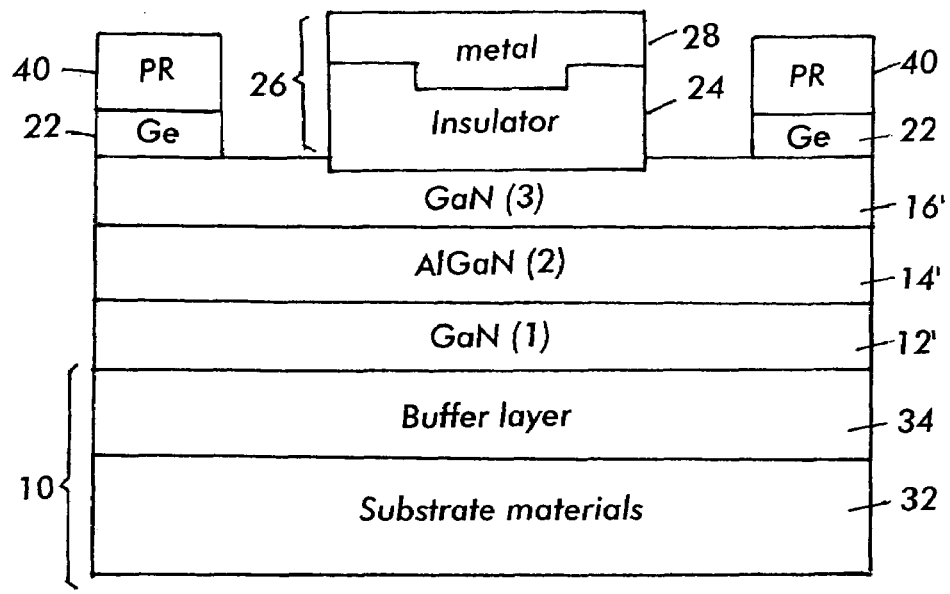
Figure 7E:
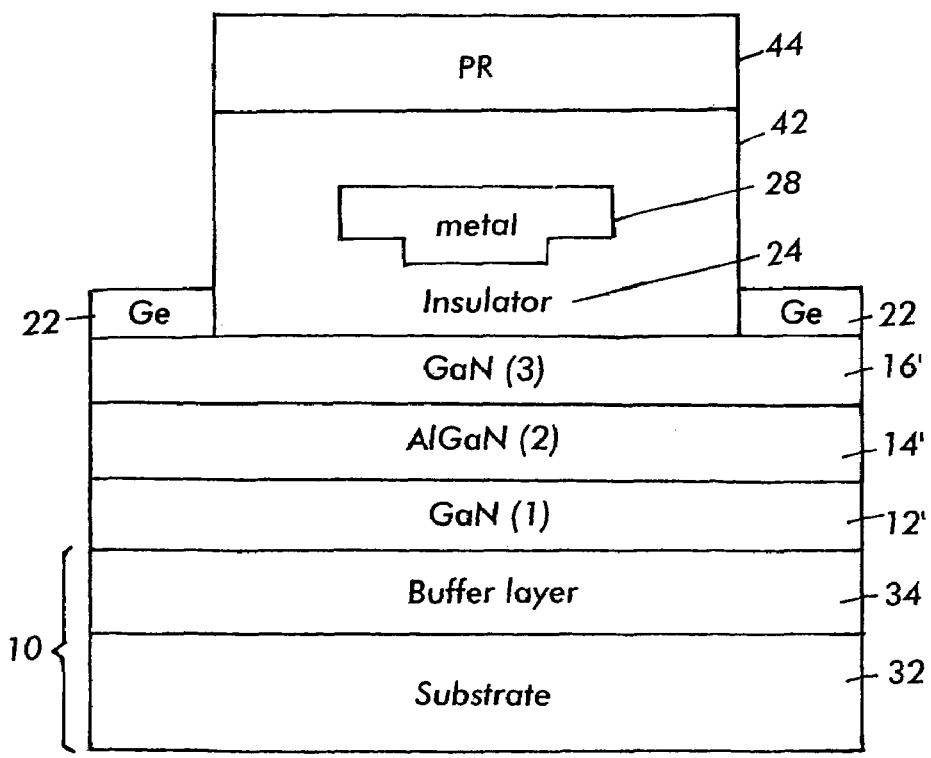
Figure 7F:
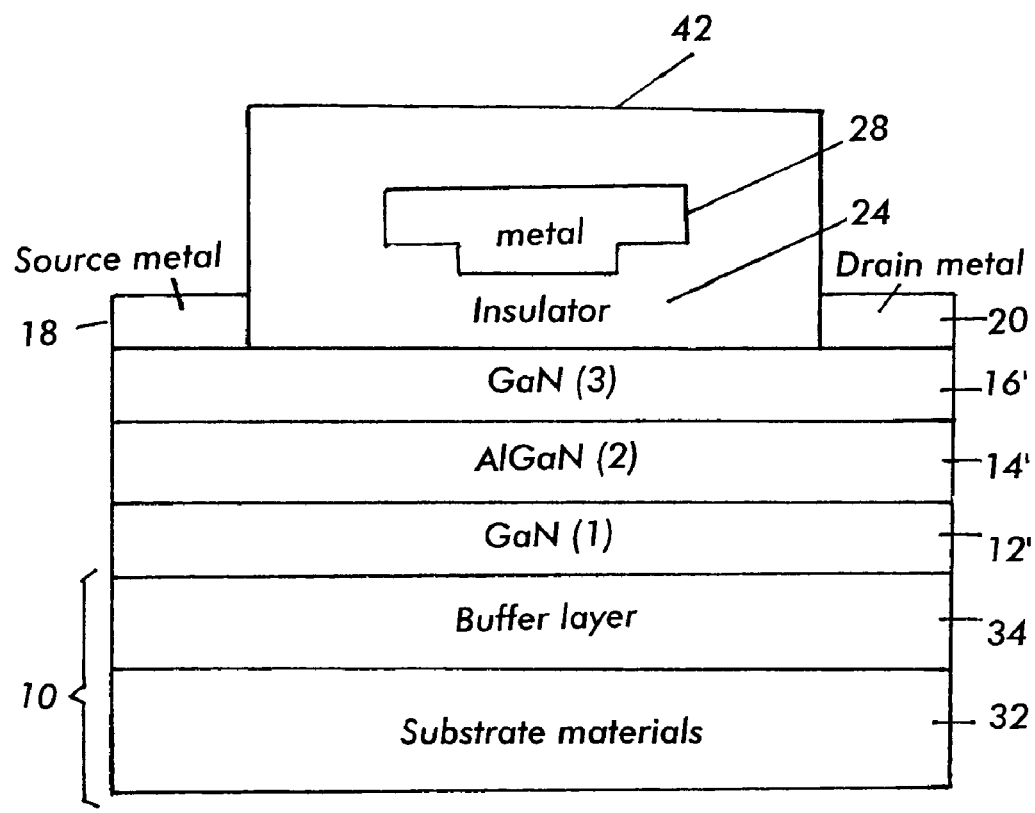

Next, first power electrode mask 40 is applied to protective spacer body 22. Mask 40 defines portions of spacer body 22 adjacent gate structure 26 for removal and through etching or the like unmasked portions of spacer body 22 adjacent gate structure 26 are removed preferably exposing at third III-nitride semiconductor body 16' as illustrated by FIG. 7D. Then, an insulation body 42 is formed over at least gate structure 26 filling preferably the space between gate structure 26 and spacer bodies 22. Next, second power electrode mask 44 is applied over at first insulation body 42 as illustrated by FIG. 7E. Thereafter, spacer bodies 22 adjacent insulation body 42 are removed exposing portions of third III-nitride semiconductor body 16' adjacent insulation body 42, and first (18) and second (20) power electrodes are formed on the exposed portions of third III-nitride semiconductor body 16'. The result is a device fabricated according to the third embodiment as illustrated by FIG. 7F.

Note that in an alternative embodiment, gate structure 26 may include a body in schottky contact with third III-nitride semiconductor body 16'. In such a case, gate insulation body 24 may be omitted from the process, and only a gate schottky body may be formed over spacer body 22 after the patterning thereof. The remainder of the fabrication process may be the same as that detailed above with reference to the third embodiment of the present invention.

Note that although the preferred material for protective body 22 is Ge, other materials such as $SiO_2$, $Si_3N_4$, $Al_2O_3$, or the like may be used without deviating from the scope and spirit of the present invention.

N-face III-nitride semiconductor films are very sensitive to acids and thus can be easily etched by HCl and a photo resist developer. Furthermore, the plasma in the dry etching process damages the materials and increases the surface roughness under the power electrodes. It is believed that the rough surface may lead to high ohmic contact resistance.

In a process according to the present invention, protective spacer body 22 protects the N-polar III-nitride body from damage, and also provides a stop barrier to prevent the plasma damage in the dry etching.

Note also that third and fourth III-nitride bodies are usually thin (<100 nm). Over-etching at the location of the power electrodes will reduce the 2DEG density, hence, increase on resistance. Neither dry nor wet etching is controllable to remove such thin film. In a process according to the invention, all the film thicknesses are preferably defined by MBE in which the growth rate can be precisely monitored. $H_2O_2$ can be used to selectively remove the protective spacer body (if Ge is chosen as spacer material) at the location of the power electrodes without damaging the III-nitride underneath.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a semiconductor device, comprising:
   growing a first N-polar III-nitride semiconductor body over a support body;
   growing a second N-polar III-nitride semiconductor body over said first N-polar III-nitride semiconductor body;
   growing a third N-polar III-nitride semiconductor body over said second N-polar III-nitride semiconductor body;
   growing a protective spacer body over said third III-nitride semiconductor body;
   removing a portion of said protective spacer body to define an opening therein exposing a portion of said third III-nitride semiconductor body;
   growing a fourth N-polar III-nitride semiconductor body at least over said exposed portion;
   forming a gate structure over said fourth III-nitride semiconductor body; and
   forming power electrodes each electrically coupled to said third III-nitride semiconductor body.

2. The process of claim 1, wherein said first and said third III-nitride semiconductor bodies are comprised of GaN, and said second and said fourth III-nitride semiconductor bodies are comprised of AlGaN.

3. The process of claim 1, wherein said support body is comprised of a substrate and a buffer layer disposed on said substrate.

4. The process of claim 3, wherein said substrate is comprised of silicon.

5. The process of claim 3, wherein said substrate is comprised of silicon carbide.

6. The process of claim 3, wherein said substrate is comprised of sapphire.

7. The process of claim 3, wherein said buffer layer is comprised of a III-nitride body.

8. The process of claim 3, wherein said buffer layer is comprised of AlN.

9. The process of claim 1, wherein said support body is comprised of a III-nitride material.

10. The process of claim 1, wherein said support body is comprised of GaN.

11. The process of claim 1, wherein said gate structure is comprised of a gate insulation and a gate electrode.

12. The process of claim 1, wherein said gate structure makes a schottky contact with said fourth III-nitride semiconductor body.

13. The process of claim 1, wherein said protective spacer body is comprised of at least one of Ge, $SiO_2$, $Si_3N_4$, and $Al_2O_3$.

14. A process for fabricating a semiconductor device, comprising:
   growing a first N-polar III-nitride semiconductor body over a support body;
   growing a second N-polar III-nitride semiconductor body over said first N-polar III-nitride semiconductor body;
   growing a third N-polar III-nitride semiconductor body over said second N-polar III-nitride semiconductor body;
   growing a protective spacer body over said third N-polar III-nitride semiconductor body;
   removing a portion of said protective spacer body to define an opening therein exposing a portion of said third N-polar III-nitride semiconductor body;
   forming a gate structure over said third N-polar III-nitride semiconductor body; and
   forming power electrodes each electrically coupled to said third N-polar III-nitride semiconductor body after forming said gate structure.

15. The process of claim 14, further comprising removing a portion of said protective spacer body adjacent said gate structure to expose at least said third III-nitride semiconductor body, forming an insulation body over said gate structure and at least over said exposed portion adjacent said gate structure, removing at least a portion of the remainder of said protective spacer body to expose at least a portion of said third III-nitride semiconductor body; and forming power electrodes over said exposed portions of said third III-nitride semiconductor body.

16. The process of claim 14, wherein said first and said third III-nitride semiconductor bodies are comprised of GaN, and said second III-nitride semiconductor body is comprised of AlGaN.

17. The process of claim 14, wherein said support body is comprised of a substrate and a buffer layer disposed on said substrate.

18. The process of claim 17, wherein said substrate is comprised of at least one of silicon, silicon carbide, or sapphire.

19. The process of claim 17, wherein said buffer layer is comprised of a III-nitride body.

20. The process of claim 17, wherein said buffer layer is comprised of AlN.

21. The process of claim 14, wherein said support body is comprised of a III-nitride material.

22. The process of claim 14, wherein said support body is comprised of GaN.

23. The process of claim 14, wherein said gate structure is comprised of a gate insulation and a gate electrode.

24. The process of claim 14, wherein said gate structure makes a schottky contact with said fourth III-nitride semiconductor body.

25. The process of claim 14, wherein said protective spacer body is comprised of one of Ge, $SiO_2$, $Si_3N_4$ and $Al_2O_3$.

* * * * *